(12) United States Patent
Nakamura

(10) Patent No.: US 9,332,647 B2
(45) Date of Patent: May 3, 2016

(54) ETCHING METHOD

(71) Applicant: MIMAKI ENGINEERING CO., LTD., Nagano (JP)

(72) Inventor: Norikazu Nakamura, Nagano (JP)

(73) Assignee: MIMAKI ENGINEERING CO., LTD., Nagano (JP)

( * ) Notice: Subject to any disclaimer, the term of this patent is extended or adjusted under 35 U.S.C. 154(b) by 0 days.

(21) Appl. No.: 14/436,475

(22) PCT Filed: Oct. 9, 2013

(86) PCT No.: PCT/JP2013/077448
§ 371 (c)(1),
(2) Date: Apr. 16, 2015

(87) PCT Pub. No.: WO2014/061522
PCT Pub. Date: Apr. 24, 2014

(65) Prior Publication Data
US 2015/0305165 A1 Oct. 22, 2015

(30) Foreign Application Priority Data
Oct. 19, 2012 (JP) .................... 2012-232130

(51) Int. Cl.
*B44C 1/22* (2006.01)
*H05K 3/06* (2006.01)
*H05K 3/00* (2006.01)
*G03F 7/00* (2006.01)

(52) U.S. Cl.
CPC .............. *H05K 3/064* (2013.01); *G03F 7/0002* (2013.01); *H05K 3/0076* (2013.01); *H05K 2203/013* (2013.01); *H05K 2203/0551* (2013.01); *H05K 2203/0562* (2013.01)

(58) Field of Classification Search
CPC ..................................... H05K 3/064

USPC ........................................ 216/13, 49
See application file for complete search history.

(56) References Cited

U.S. PATENT DOCUMENTS

2011/0024392 A1* 2/2011 Sato .................. C09D 11/101
216/48
2012/0052773 A1* 3/2012 Mase .................. B24C 1/045
451/38

FOREIGN PATENT DOCUMENTS

| JP | 06-228774 | 8/1994 |
| JP | 2009-173712 | 8/2009 |
| JP | 2012-140491 | 7/2012 |
| JP | 2012-140492 | 7/2012 |
| JP | 2012-140493 | 7/2012 |

OTHER PUBLICATIONS

"International Search Report (Form PCT/ISA/210)", mailed on Jan. 14, 2014, with English translation thereof, pp. 1-4.

* cited by examiner

*Primary Examiner* — Roberts Culbert
(74) *Attorney, Agent, or Firm* — Jiang Chyun Intellectual Property Office

(57) ABSTRACT

A solution is characteristic in being an etching method that processes a surface of a target object by corroding the surface by a corrosive, and the etching method includes: a resist forming step of forming a resist on the surface using resist liquid by ink jet printing the resist liquid on the surface; a surface corroding step of corroding a portion of the surface where the resist is not formed by bringing the corrosive into contact with a surface side of the target object where the resist has been formed in the resist forming step; and a resist detaching step of detaching the resist from the surface after the surface corroding step, wherein the resist forming step is a step of forming the resist by the resist liquid containing monofunctional monomers or monofunctional oligomers, and polyfunctional monomers or polyfunctional oligomers.

5 Claims, 4 Drawing Sheets

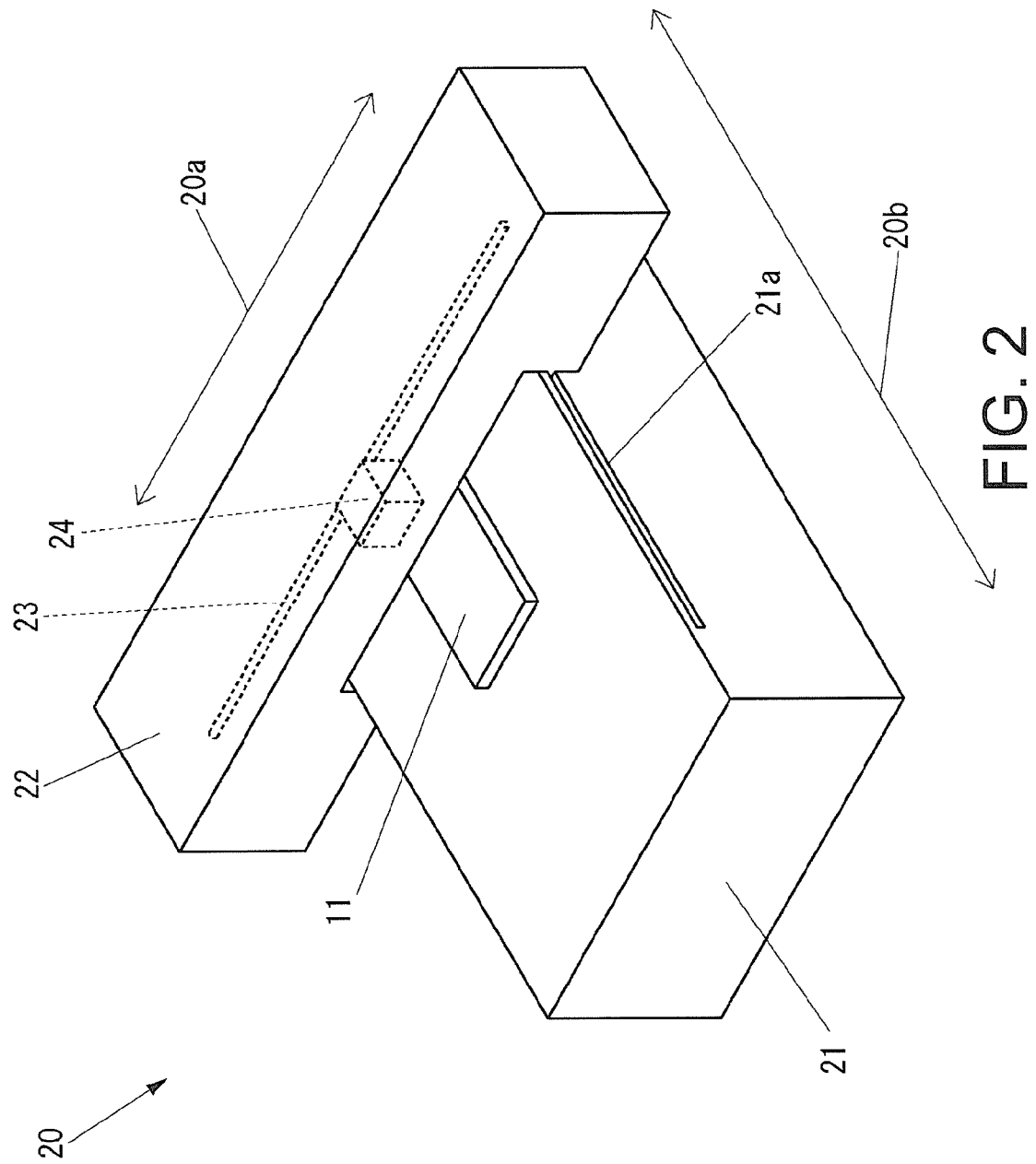

ETCHING METHOD

CROSS-REFERENCE TO RELATED APPLICATION

This application is a 371 application of an international PCT application serial no. PCT/JP2013/077448, filed on Oct. 9, 2013, which claims the priority benefit of Japan application no. 2012-232130, filed on Oct. 19, 2012. The entirety of each of the above-mentioned patent applications is hereby incorporated by reference herein and made a part of this specification.

TECHNICAL FIELD

The present invention relates to an etching method that processes a surface of a target object by corroding the surface of the target object by a corrosive.

BACKGROUND ART

Conventionally, as an etching method that processes a surface of a target object by corroding the surface of the target object by a corrosive, a method is known that includes a resist forming step for forming a resist on the surface of the target object using resist liquid, such as oleoresinous liquid, ultraviolet curing resinous liquid and the like, by ink jet printing the resist liquid on the surface of the target object, a surface corroding step for corroding a portion of the surface of the target object where the resist is not formed by bringing the corrosive into contact with a surface side of the target object where the resist has been formed by the resist forming step, and a resist detaching step for detaching the resist from the surface of the target object after the surface corroding step (see Patent Document 1).

PRIOR ART DOCUMENT

Patent Document

Patent Document 1: JP H6-228774 A

SUMMARY OF THE INVENTION

Problem to be Solved by the Invention

However, in a conventional etching method, there is a case where a portion that is not planned to be corroded within the surface of the target object is undesirably corroded by the resist being unexpectedly detached from the surface of the target object by the corrosive in the surface corroding step. Further, in the conventional etching method, there also is a case where the resist does not detach from the surface of the target object in the resist detaching step and remains on the surface of the target object. That is, in the conventional etching method, there is a problem of defective yield.

Thus, the present invention aims to provide an etching method that can improve the yield compared to the conventional configuration.

Solutions to the Problem

An etching method of the present invention is an etching method that processes a surface of a target object by corroding the surface by a corrosive, and the method includes: a resist forming step of forming a resist on the surface using resist liquid by ink jet printing the resist liquid on the surface; a surface corroding step of corroding a portion of the surface where the resist is not formed by bringing the corrosive into contact with a surface side of the target object where the resist has been formed in the resist forming step; and a resist detaching step of detaching the resist from the surface after the surface corroding step, wherein the resist forming step is a step of forming the resist by the resist liquid containing monofunctional monomers or monofunctional oligomers, and polyfunctional monomers or polyfunctional oligomers.

According to this configuration, the etching method of the present invention prevents the resist from detaching from the surface of the target object in the surface corroding step by the polyfunctional monomers or polyfunctional oligomers having a high crosslink density and low solubility, and allows the resist to detach easily from the surface of the target object in the resist detaching step by the monofunctional monomers or monofunctional oligomers having low crosslink density and high solubility, so yield can be improved compared to the conventional art.

Further, in the etching method of the present invention, the resist forming step may be a step of forming the resist by the resist liquid containing the monofunctional monomers or the monofunctional oligomers by 40 mass % or more, and the polyfunctional monomers or the polyfunctional oligomers by 30 mass % or less.

Further, in the etching method of the present invention, the resist forming step may be an UV ink jet printing step, which prints the resist liquid of an ultraviolet curing type.

According to this configuration, the resist liquid is the ultraviolet curing type liquid in the etching method of the present invention, so that a curing speed of the resist liquid is faster compared to a configuration in which the resist liquid is of an organic solvent type, as a result of which a speed of an entirety of series of processing can be improved.

Further, in the etching method of the present invention, the resist forming step may be a step of forming the resist by the resist liquid containing isobornyl acrylate as the monofunctional monomers.

Further, in the etching method of the present invention, the resist forming step may be a step of forming the resist by the resist liquid containing acrylic ester as the monofunctional monomers.

Further, in the etching method of the present invention, the resist forming step may be a step of forming the resist by the resist liquid containing amine-modified acrylic oligomers as the monofunctional monomers.

Effects of the Invention

The etching method of the present invention can improve yield compared to the conventional art.

BRIEF DESCRIPTION OF THE DRAWINGS

FIG. 2 is a perspective diagram of an ink jet printer used in the manufacture of the processed article shown in FIG. 1.

EMBODIMENTS OF THE INVENTION

One embodiment of the present invention will be described hereinbelow with reference to the drawings.

Firstly, a configuration of a processed article manufactured by the etching method according to the present embodiment will be described.

Figure 1:
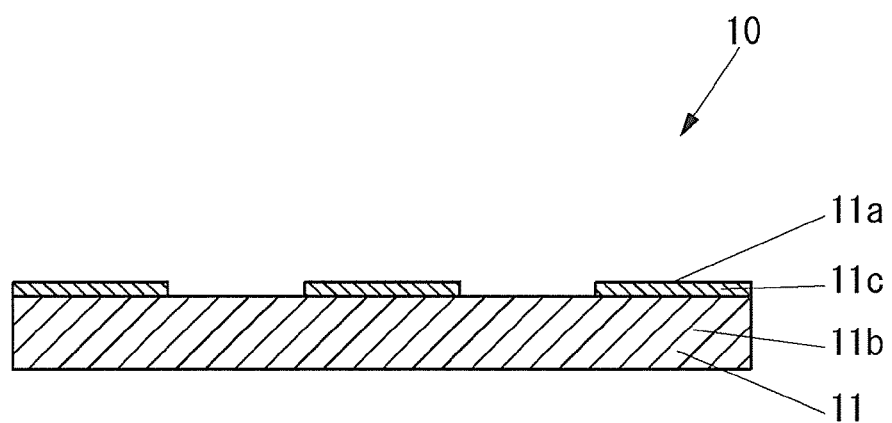
FIG. 1 is a lateral cross sectional diagram of a processed article manufactured by an etching method according to one embodiment of the present invention.

FIG. 1 is a lateral cross sectional diagram of a processed article 10 manufactured by an etching method according to the present embodiment.

As shown in FIG. 1, the processed article 10 is an object formed by a surface 11a of a target object 11 being recessed. For example, the processed article 10 is a printed circuit board in which a conductor layer 11c being a layer of a conductor such as copper is coated on a substrate 11b of an insulator.

Next, a configuration of an ink jet printer used in the manufacture of the processed article 10 will be described.

FIG. 2 is a perspective diagram of an ink jet printer 20 used in the manufacture of the processed article 10.

As shown in FIG. 2, the ink jet printer 20 includes a table 21 for mounting the target object 11, and a main body 22 extending in a main scanning direction shown by an arrow 20a.

The table 21 includes guiding mechanisms 21a that extend in a sub scanning direction shown by an arrow 20b, and movably support the main body 22 in the sub scanning direction shown by the arrow 20b on both sides in the main scanning direction shown by the arrow 20a.

The main body 22 includes a guide rail 23 extending in the main scanning direction shown by the arrow 20a, and a carriage 24 movably supported on the guide rail 23 in the main scanning direction shown by the arrow 20a. The carriage 24 has installed therein a recording head that is not shown and that is for discharging droplets of ultraviolet curing type liquid toward the table 21, and an LED (Light Emitting Diode) that is not shown and that is for delivering ultraviolet ray toward the table 21 for curing the ultraviolet curing type liquid discharged by the recording head.

Next, an etching method for processing the surface 11a of the target object 11 by corroding the surface 11a of the target object 11 by a corrosive, that is, a manufacturing method of the processed article 10 will be described.

Figure 3A:
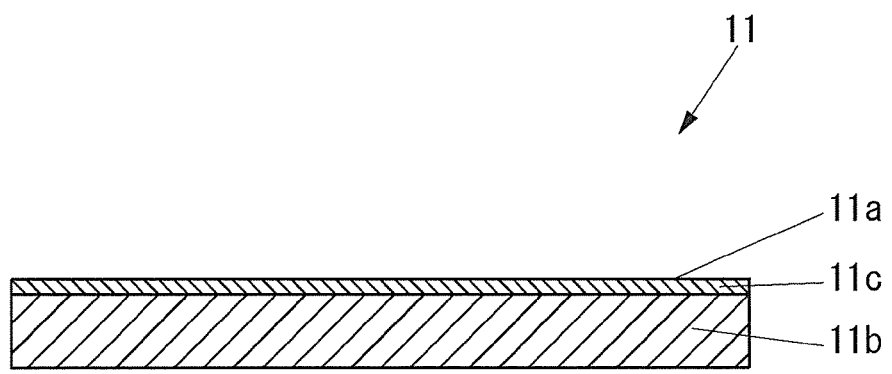
FIG. 3A is a lateral cross sectional diagram of a target object before being processed by the etching method according to one embodiment of the present invention.
Figure 3B:
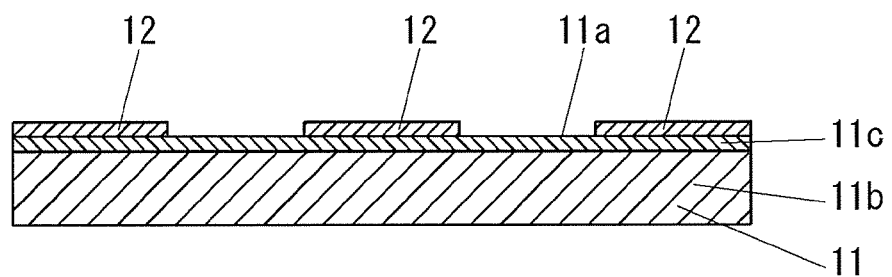
FIG. 3B is a lateral cross sectional diagram of the target object shown in FIG. 3A, on a surface of which a resist is formed.

FIG. 3A is a lateral cross sectional diagram of the target object 11 before being processed by the etching method according to the present embodiment. FIG. 3B is a lateral cross sectional diagram of the target object 11 on the surface 11a of which a resist 12 is formed.

1. Resist Forming Step

An operator fixes the target object 11 shown in FIG. 3A at a predetermined position on the table 21 of the ink jet printer 20, and instructs the ink jet printer 20 to record an image based on arbitrary print data by the ultraviolet curing type resist liquid on the target object 11.

The ink jet printer 20 given the instruction from the operator moves the carriage 24 along the guide rail 23 in the main scanning direction shown by the arrow 20a relative to the table 21, and moves the main body 22 along the guiding mechanisms 21a in the sub scanning direction shown by the arrow 20b relative to the table 21. That is, the ink jet printer 20 moves the carriage 24 relative to the target object 11 fixed on the table 21 in accordance with the print data. Then, the ink jet printer 20 discharges the ultraviolet curing type resist liquid by the recording head on the carriage 24 toward the target object 11 fixed on the table 21, and delivers ultraviolet ray by the LED on the carriage 24 toward the ultraviolet curing type resist liquid discharged on the target object 11. That is, the ink jet printer 20 forms the resist 12 by the ultraviolet curing type resist liquid on the target object 11, as shown in FIG. 3B, by UV ink jet printing the ultraviolet curing type resist liquid on the target object 11 in a form of the image based on the print data.

It should be noted that the resist liquid used in the resist forming step is a resist ink of a radically polymerized type containing monofunctional monomers or monofunctional oligomers, and polyfunctional monomers or polyfunctional oligomers. Especially, the resist liquid preferably contains the monofunctional monomers or monofunctional oligomers by 40 mass % or more (more preferably 60 mass % or more), and the polyfunctional monomers or polyfunctional oligomers by 30 mass % or less. Here, as the monofunctional monomers, for example, isobornyl acrylate, acrylic ester and the like can be employed. Further, as the polyfunctional monomers, for example, amine-modified acrylic oligomers and the like can be employed.

2. Surface Corroding Step

Next, the operator detaches the target object 11 from the table 21 of the ink jet printer 20, and immerses the target object 11 detached from the table 21 of the ink jet printer 20 in a solution of iron (III) chloride as the corrosive. That is, the operator brings the corrosive into contact with a surface 11a side of the target object 11 on which the resist 12 is formed. Accordingly, a portion of the surface 11a of the target object 11 where the resist 12 is not formed is corroded by the corrosive.

Figure 4:
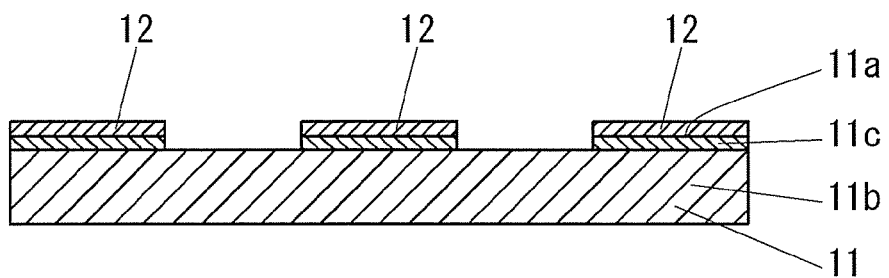
FIG. 4 is a lateral cross sectional diagram of the target object shown in FIG. 3A and FIG. 3B, of which portion within its surface where the resist is not formed is corroded.

FIG. 4 is a lateral cross sectional diagram of the target object 11 having the portion of the surface 11a where the resist 12 is not formed corroded.

For example, the target object 11 of which portion of the surface 11a where the resist 12 is not formed is corroded in the surface corroding step comes to look like that shown in FIG. 4.

3. Resist Detaching Step

Next, the operator takes out the target object 11 from the solution of iron (III) chloride as the corrosive, and immerses the target object 11 taken out of the solution of iron (III) chloride in a detaching solution. Accordingly, the resist 12 on the surface 11a of the target object 11 is detached from the surface 11a of the target object 11 by being swollen or dissolved by the detaching solution.

The target object 11 where the resist 12 was detached from the surface 11a in the resist detaching step is for example completed as the processed article 10 as shown in FIG. 1.

As described above, the etching method according to the present embodiment prevents the resist 12 from being detached from the surface 11a of the target object 11 in the surface corroding step by the polyfunctional monomers or polyfunctional oligomers having high crosslink density and low solubility, and the resist 12 is easily detached from the surface 11a of the target object 11 in the resist detaching step by the monofunctional monomers or monofunctional oligomers having low crosslink density and high solubility, whereby the yield can be improved compared to the conventional configurations.

Further, in the etching method according to the present embodiment, since the resist liquid used in the resist forming step is ultraviolet curing type liquid, curing speed of the resist liquid is fast compared to a configuration in which the resist liquid is of an organic solvent type, as a result of which a speed of an entirety of series of processing can be improved.

It should be noted that the etching method according to the present embodiment is used in manufacturing print circuit boards, however, it may be used for manufacturing objects other than print circuit boards, for example name plates and the like.

Further, the etching method according to the present embodiment employs an object in which the conductor layer 11c is coated on the substrate 11b as the target object 11, however, objects other than those having the conductor layer 11c coated on the substrate 11b, for example, a metal plate and the like, may be employed as the target object 11.

Further, the etching method according to the present embodiment employs ultraviolet curing type liquid as the resist liquid used in the resist forming step, however, resist liquid other than the ultraviolet curing type, for example organic solvent type resist liquid and the like, may be employed.

Further, the etching method according to the present embodiment employs copper as the object to be corroded in the surface corroding step, however, a substance other than copper may be employed.

Further, the etching method according to the present embodiment employs the aqueous solution of iron (III) chloride as the corrosive used in the surface corroding step, however, a corrosive other than the aqueous solution of iron (III) chloride may be employed so long as it is a substance that can corrode only the surface 11a of the target object 11 among the surface 11a of the target object 11 and the resist 12.

Further, the etching method according to the present embodiment employs wet etching to corrode the surface 11a of the target object 11 by the liquid corrosive in the surface corroding step, however, dry etching that corrodes the surface 11a of the target object 11 by a gaseous corrosive may be employed.

Further, the detaching solution used in the resist detaching step of the etching method according to the present embodiment will suffice so long as it is a substance that can detach the resist 12 from the surface 11a of the target object 11. For example in case where at least a part of the monofunctional monomers or monofunctional oligomers and the polyfunctional monomers or polyfunctional oligomers contained in the resist liquid include free acid radicals (acrylic acid derivatives) and the acid value thereof is 100 or more, aqueous solution of hydroxides of alkali metal such as sodium hydroxide and the like, or of basic compounds such as N-methyldiethanolamine, pyridine, piperidine and the like may be employed as the detaching solution.

The invention claimed is:

1. An etching method that processes a surface of a target object by corroding the surface by a corrosive, and the etching method comprising:
   a resist forming step of forming a resist on the surface using resist liquid by ink jet printing the resist liquid on the surface;
   a surface corroding step of corroding a portion of the surface where the resist is not formed by bringing the corrosive into contact with a surface side of the target object where the resist was formed in the resist forming step; and
   a resist detaching step of detaching the resist from the surface after the surface corroding step,
   wherein the resist forming step is a step of forming the resist by the resist liquid containing monofunctional monomers or monofunctional oligomers, and amine-modified acrylic oligomers as polyfunctional monomers,
   the surface corroding step is wet etching to corrode by a liquid corrosive.

2. The etching method according to claim 1, wherein the resist forming step is a step of forming the resist by the resist liquid containing the monofunctional monomers or the monofunctional oligomers by 40 mass % or more, and the polyfunctional monomers or the polyfunctional oligomers by 30 mass % or less.

3. The etching method according to claim 1, wherein the resist forming step is an UV ink jet printing step, which prints the resist liquid of an ultraviolet curing type.

4. The etching method according to claim 1, wherein the resist forming step is a step of forming the resist by the resist liquid containing isobornyl acrylate as the monofunctional monomers.

5. The etching method according to claim 1, wherein the resist forming step is a step of forming the resist by the resist liquid containing acrylic ester as the monofunctional monomers.

* * * * *